United States Patent
Tian et al.

(10) Patent No.: US 10,789,868 B2
(45) Date of Patent: Sep. 29, 2020

(54) SHIFT REGISTER CIRCUIT AND METHOD FOR DRIVING THE SAME, GATE DRIVING CIRCUIT AND METHOD FOR DRIVING THE SAME, AND DISPLAY APPARATUS

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Zhenguo Tian, Beijing (CN); Shuai Chen, Beijing (CN); Xiuzhu Tang, Beijing (CN); Shuang Hu, Beijing (CN); Lijun Xiong, Beijing (CN); Xing Dong, Beijing (CN); Taoliang Tang, Beijing (CN); Xuebo Liang, Beijing (CN); Zhi Zhang, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 151 days.

(21) Appl. No.: 16/048,069

(22) Filed: Jul. 27, 2018

(65) Prior Publication Data
US 2019/0206294 A1 Jul. 4, 2019

(30) Foreign Application Priority Data
Jan. 2, 2018 (CN) .......................... 2018 1 0002108

(51) Int. Cl.
*G11C 19/00* (2006.01)
*G09G 3/20* (2006.01)
(Continued)

(52) U.S. Cl.
CPC ............... *G09G 3/20* (2013.01); *G11C 19/28* (2013.01); *G11C 19/287* (2013.01);
(Continued)

(58) Field of Classification Search
None
See application file for complete search history.

(56) References Cited

U.S. PATENT DOCUMENTS 7,215,315 B2 * 5/2007 Morosawa ............. G11C 19/00
345/100
8,422,621 B2 * 4/2013 Jang ..................... G09G 3/3677
377/64
(Continued)

FOREIGN PATENT DOCUMENTS

CN 103927960 A 7/2014
CN 104299583 * 1/2015
(Continued)

OTHER PUBLICATIONS

First Chinese Office Action dated Mar. 19, 2020, for corresponding Chinese Application No. 201810002108.2.

*Primary Examiner* — Tuan T Lam
(74) *Attorney, Agent, or Firm* — Kinney & Lange, P.A.

(57) ABSTRACT

The present disclosure proposes a shift register circuit and a method for driving the same, a gate driving circuit and a method for driving the same, and a display apparatus. The shift register circuit comprises an input circuit, a reset circuit, a control circuit and a multi-output circuit. The input circuit is configured to receive an input signal and output a signal to a first node based on the input signal; the reset circuit is configured to receive a reset signal and a first reference signal, and output the first reference signal to the first node under control of the reset signal; the control circuit is configured to control a potential at the first node to be an inverted potential of a potential at the second node; and the
(Continued)

multi-output circuit is configured to receive the first reference signal and a plurality of clock signals, and output a plurality of driving signals according to the corresponding clock signals and the first reference signal under the control of signals at the first node and the second node.

17 Claims, 12 Drawing Sheets

(51) Int. Cl.
    *G11C 19/28*     (2006.01)
    *G09G 3/36*     (2006.01)

(52) U.S. Cl.
    CPC ... *G09G 3/3677* (2013.01); *G09G 2300/0809* (2013.01); *G09G 2310/0267* (2013.01); *G09G 2310/0286* (2013.01); *G09G 2310/08* (2013.01)

(56) References Cited

U.S. PATENT DOCUMENTS

| | | | |
|---|---|---|---|
| 9,984,642 | B2 | 5/2018 | Lv et al. |
| 2008/0101529 | A1* | 5/2008 | Tobita .................. G09G 3/3677 377/64 |
| 2013/0027378 | A1 | 1/2013 | Lee et al. |
| 2014/0198022 | A1* | 7/2014 | Chou .................. G09G 3/3677 345/92 |
| 2015/0213762 | A1* | 7/2015 | Xia ...................... G09G 3/3266 345/215 |
| 2016/0155422 | A1* | 6/2016 | Sun ........................ G09G 3/20 345/213 |
| 2016/0187917 | A1* | 6/2016 | Lou ..................... G09G 3/2096 345/213 |
| 2016/0247479 | A1 | 8/2016 | Cho et al. |
| 2016/0351110 | A1 | 12/2016 | Jin et al. |
| 2017/0330526 | A1* | 11/2017 | Fan ..................... G09G 3/3677 |
| 2018/0122289 | A1 | 5/2018 | Gu et al. |
| 2018/0182300 | A1 | 6/2018 | Chen et al. |

FOREIGN PATENT DOCUMENTS

| | | | |
|---|---|---|---|
| CN | 105047120 | A | 11/2015 |
| CN | 105047228 | * | 11/2015 |
| CN | 105529009 | A | 4/2016 |
| CN | 205282054 | U | 6/2016 |
| CN | 106023943 | A | 10/2016 |
| CN | 106409207 | A | 2/2017 |
| CN | 107316603 | A | 11/2017 |
| CN | 107464521 | A | 12/2017 |
| KR | 1020130062127 | * | 12/2013 |

* cited by examiner

SHIFT REGISTER CIRCUIT AND METHOD FOR DRIVING THE SAME, GATE DRIVING CIRCUIT AND METHOD FOR DRIVING THE SAME, AND DISPLAY APPARATUS

CROSS-REFERENCE TO RELATED APPLICATION(S)

This application claims priority to the Chinese Patent Application No. 201810002108.2, filed on Jan. 2, 2018, which is incorporated herein by reference in its entirety.

TECHNICAL FIELD

The present disclosure relates to the field of display technologies, and more particularly, to a shift register circuit and a method for driving the same, a gate driving circuit and a method for driving the same, and a display apparatus.

BACKGROUND

A gate driving circuit in the related art is composed of multiple stages of cascaded shift register circuits, and each of the stages of shift register circuits is connected to a corresponding gate line, so that a scanning signal is input to various rows of gate lines in a display panel sequentially through various stages of shift register circuits. However, such a gate driving circuit has a complicated structure design, and occupies a large space of the display panel, which is disadvantageous for ultra-narrow bezel design of the display panel.

SUMMARY

The embodiments of the present disclosure provide a shift register circuit, comprising an input circuit, a reset circuit, a control circuit and a multi-output circuit, wherein the input circuit is configured to receive an input signal and output a signal to a first node based on the input signal;

the reset circuit is configured to receive a reset signal and a first reference signal, and output the first reference signal to the first node under control of the reset signal;

the control circuit is configured to control a potential at the first node to be an inverted potential of a potential at the second node; and the multi-output circuit is configured to receive the first reference signal and M clock signals, and output M driving signals according to the corresponding clock signals and the first reference signal under the control of signals at the first node and the second node, where M is an integer greater than or equal to 2.

In an embodiment, the multi-output circuit comprises M output sub-circuits each configured to receive the first reference signal and a corresponding one of the M clock signals, and output a corresponding driving signal according to the received first reference signal and corresponding clock signal under the control of the signals at the first node and the second node.

In an embodiment, the output sub-circuit comprises a first switch transistor, a second switch transistor, and a storage capacitor, wherein the first switch transistor has a gate connected to the first node, a first electrode configured to receive a corresponding clock signal, and a second electrode configured to output a corresponding driving signal;

the second switch transistor has a gate connected to the second node, a first electrode configured to receive the first reference signal, and a second electrode configured to output the corresponding driving signal; and the storage capacitor is connected between the first node and the second electrode of the first switch transistor.

In an embodiment, the M driving signals are sequentially defined as a first driving signal to an $M^{th}$ driving signal in a scanning order; and the reset circuit is further configured to receive the $M^{th}$ driving signal, a second reference signal, and a frame reset signal, and output the first reference signal to the first node under the control of all the $M^{th}$ driving signal, the frame reset signal, and the reset signal.

In an embodiment, the reset circuit comprises a third switch transistor, a fourth switch transistor, a fifth switch transistor, a sixth switch transistor, and a stabilization capacitor, wherein the third switch transistor has a gate configured to receive the $M^{th}$ driving signal, a first electrode configured to receive the second reference signal, and a second electrode connected to a gate of the fourth switch transistor;

the fourth switch transistor has a first electrode configured to receive the reset signal, and a second electrode connected to a gate of the fifth switch transistor;

the fifth switch transistor has a first electrode configured to receive the first reference signal, and a second electrode connected to the first node;

the sixth switch transistor has a gate configured to receive the frame reset signal, a first electrode configured to receive the first reference signal, and a second electrode connected to the gate of the fourth switch transistor; and the stabilization capacitor is connected between the gate of the fourth switch transistor and the gate of the fifth switch transistor.

In an embodiment, the input circuit comprises a seventh switch transistor, wherein the seventh switch transistor has a gate and a first electrode both configured to receive the input signal, and a second electrode connected to the first node.

In an embodiment, the control circuit comprises a first control sub-circuit and a second control sub-circuit, wherein the first control sub-circuit is configured to receive the first reference signal, and output the first reference signal to the first node under control of a signal at the second node; and the second control sub-circuit is configured to receive the first reference signal and a second reference signal, output the second reference signal to the second node under control of only the second reference signal, and output the first reference signal to the second node under control of a signal at the first node.

In an embodiment, the first control sub-circuit comprises an eighth switch transistor, wherein the eighth switch transistor has a gate connected to the second node, a first electrode configured to receive the first reference signal, and a second electrode connected to the first node.

In an embodiment, the second control sub-circuit comprises a ninth switch transistor, a tenth switch transistor, an eleventh switch transistor, and a twelfth switch transistor, wherein the ninth switch transistor has a gate and a first electrode both configured to receive the second reference signal, and a second electrode connected to a gate of the tenth switch transistor;

the tenth switch transistor has a first electrode configured to receive the second reference signal, and a second electrode connected to the second node;

the eleventh switch transistor has a gate connected to the first node, a first electrode configured to receive the first reference signal, and a second electrode connected to the second node; and the twelfth switch transistor has a gate connected to the first node, a first electrode configured to receive the first reference signal, and a second electrode connected to the gate of the tenth switch transistor.

In an embodiment, the shift register circuit further comprises M frame reset circuits in one-to-one correspondence to the M output sub-circuits, and each configured to receive a frame reset signal and the first reference signal, and reset a driving signal output by a corresponding output sub-circuit according to the first reference signal under the control of the frame reset signal.

In an embodiment, the frame reset circuit comprises a thirteenth switch transistor, wherein the thirteenth switch transistor has a gate configured to receive the frame reset signal, a first electrode configured to receive the first reference signal, and a second electrode configured to output the first reference signal to reset the driving signal.

The embodiments of the present disclosure further provide a gate driving circuit, comprising N cascaded shift register circuits according to any of the above embodiments, wherein the M driving signals are sequentially defined as a first driving signal to an $M^{th}$ driving signal in a scanning order, where N is a positive integer greater than 1, wherein an input signal of a first stage of shift register circuit is a frame start signal; and an input signal of each of remaining stages of shift register circuits other than the first stage of shift register circuit is an $n^{th}$ driving signal of a previous stage of shift register circuit
where when M is an even, $$n = \frac{M}{2} + 1,$$

and when M is an odd, $$n = \frac{M+1}{2}.$$

In an embodiment, various stages of shift register circuits receive the same reset signal, wherein the reset signal is a periodic square wave signal, with each cycle comprising a turn-on period in which the reset circuit is turned on and a turn-off period in which the reset circuit is turned off, wherein each of the turn-on periods comprises a first edge and a second edge appearing successively in time, and wherein a first edge of a turn-on period of an $i^{th}$ cycle of the reset signal is synchronized with or lags behind a second edge of a current period of an $M^{th}$ clock signal in an $i^{th}$ stage of shift register circuit, and is synchronized with or is ahead of a first edge of a next cycle of the $M^{th}$ clock signal, where $1 \leq i \leq N$.

In an embodiment, various stages of shift register circuits receive the same frame reset signal, wherein a first edge of the frame reset signal lags behind or is synchronized with a second edge of a last clock signal in a last stage of shift register circuit in a current period, and a second edge of the frame reset signal is ahead of or synchronized with a first edge of a first clock signal in a first stage of shift register circuit in a next period.

The embodiments of the present disclosure further provide a display apparatus, comprising a plurality of gate lines and the gate driving circuit according to any of the above embodiments, wherein each stage of shift register circuit drives M gate lines of the plurality of gate lines, respectively.

The embodiments of the present disclosure further provide a method for driving the shift register circuit according to any of the above embodiments, comprising an input phase, an output phase, and a reset phase, comprising:

in the input phase, outputting a signal to the first node through the input circuit based on the input signal, in the output phase, outputting M driving signals according to the M clock signals through the output circuit under the control of the signal at the first node, and in the reset phase, outputting the first reference signal to the first node through the reset circuit under the control of the reset signal, and outputting the M driving signals through the multi-output circuit according to the first reference signal under the control of the signal at the second node.

The embodiments of the present disclosure further provide a method for driving the shift register circuit according to any of the above embodiments, comprising:

in a display driving phase, performing the method according to any of the above embodiments for each stage of shift register circuit in the gate driving circuit; and in a blanking time phase, resetting each of the driving signals in each stage of shift register circuit through the frame reset circuit by using the first reference signal under the control of the frame reset signal.

DETAILED DESCRIPTION

In order to make the purposes, technical solutions and advantages of the present disclosure more clear, specific implementations of the shift register circuit and the method for driving the same, the gate driving circuit and the display apparatus according to the embodiments of the present disclosure will be described in detail below with reference to the accompanying drawings. It should be understood that the preferred embodiments described below are to be construed as being illustrating and explaining the present disclosure only and not to limit the present disclosure. The embodiments in the present application and the features in the embodiments can be combined with each other without a conflict.

In the following description of the present disclosure, a specific structure of each part of the shift register circuit will be described by way of example. In a specific implementation, a specific structure of each part of the circuit is not limited to the structure according to the embodiments of the present disclosure, and may also be other structures known to those skilled in the art, which will not be limited here.

Further, in a specific implementation, in the following embodiments, all the switch transistors are set as N-type transistors. It should be understood that in other embodiments, all the switch transistors may also be P-type transistors. In this case, the technical solutions according to the present disclosure can be realized only by inverting a level of a control signal, which is not limited here in the present disclosure.

It should be noted that, in the shift register circuit according to the embodiments of the present disclosure, when all the transistors are N-type transistors, a first reference signal is a high potential signal, and a second reference signal is a low potential signal. When all the transistors are P-type transistors, the first reference signal is a low potential signal and the second reference signal is a high potential signal.

It should also be understood that a source and a drain of a transistor are interchangeable. Without loss of generality, in the embodiments of the present disclosure, a source of a transistor acts as a first electrode and a drain of the transistor acts as a second electrode. Similarly, the drain of the transistor may act as a first electrode and the source of the transistor may act as a second electrode, which are not specifically distinguished from each other here.

Figure 1:
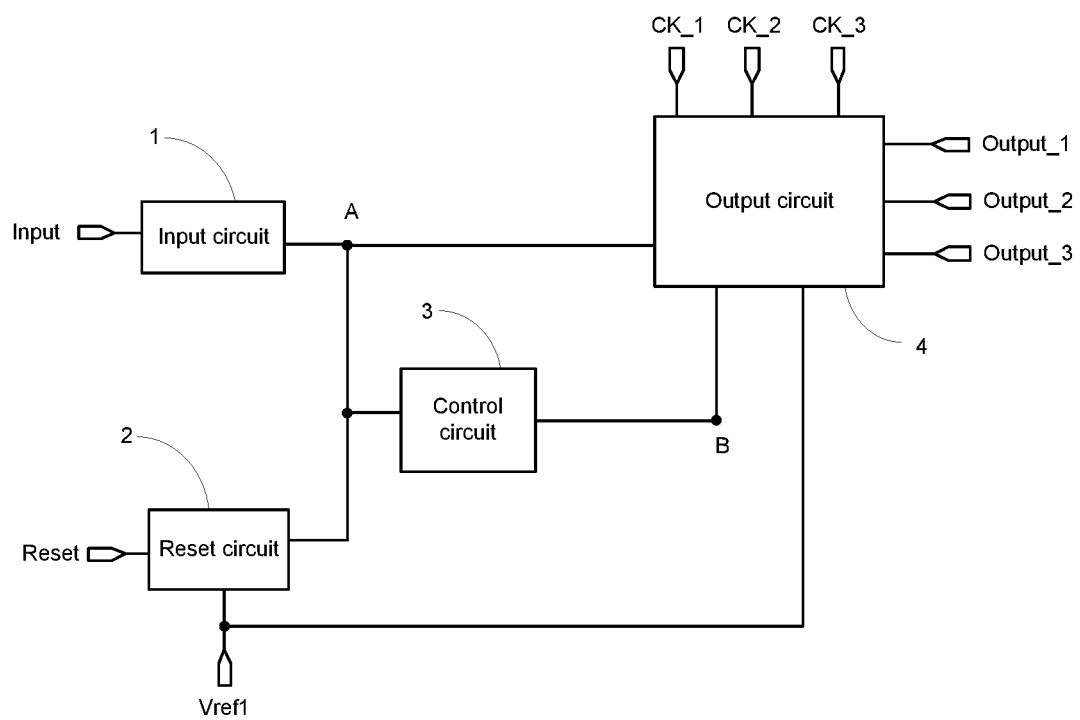
FIG. 1 is a structural diagram of a shift register circuit according to an embodiment of the present disclosure.

The embodiments of the present disclosure provide a shift register circuit, as shown in FIG. 1, comprising: an input circuit 1, a reset circuit 2, a control circuit 3, and a multi-output circuit 4.

The input circuit 1 is configured to receive an input signal Input and output a signal to a first node A based on the input signal Input. For example, the output signal may be, for example, the input signal Input or 0.

The reset circuit 2 is configured to receive a reset signal Reset and a first reference signal Vref1, and output the first reference signal Vref1 to the first node A under the control of the reset signal Reset.

In an embodiment, the reset signal Reset may be an output signal from another stage of shift register circuit. In another embodiment, as will be described below, the reset signal Reset may be a predetermined square wave signal which is common to all shift register circuits and is not related to association among various stages of shift register circuits.

The control circuit 3 is configured to control a potential at the first node A to be an inverted potential of a potential at the second node B.

Figure 2A:
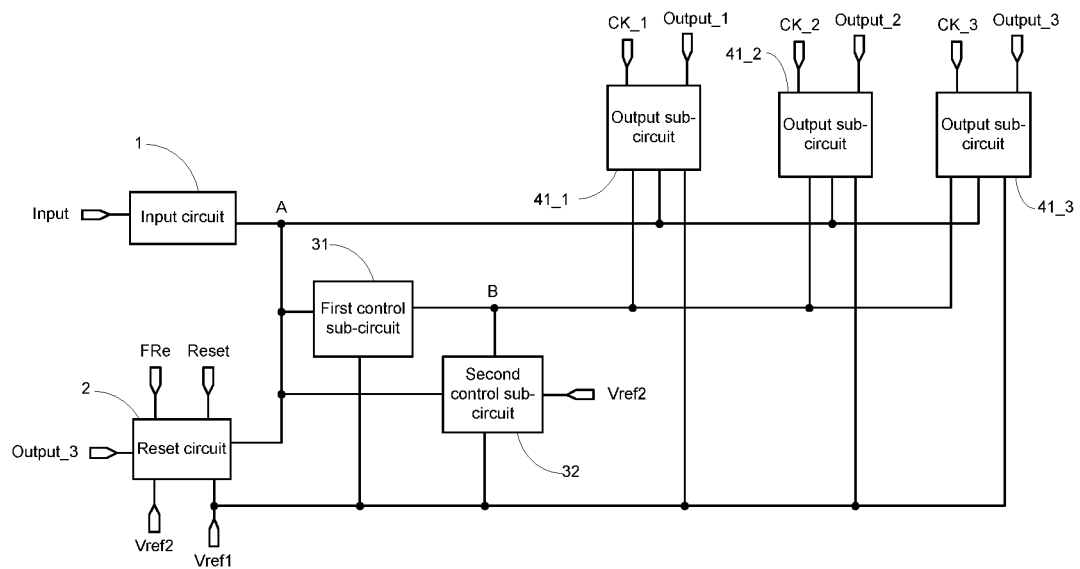
FIG. 2*a* is a structural diagram of a shift register circuit according to an embodiment of the present disclosure.
Figure 2B:
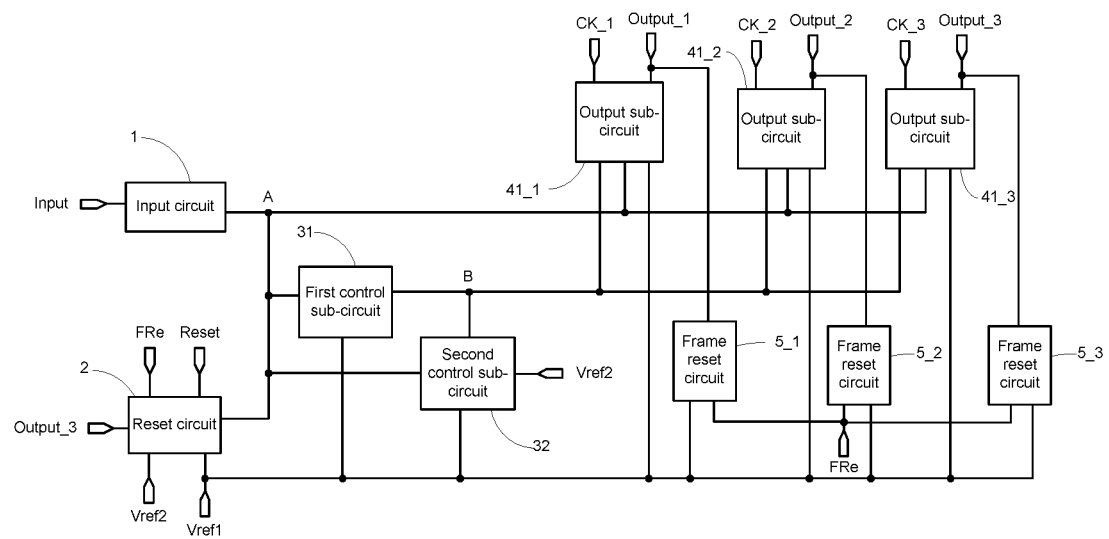
FIG. 2*b* is a structural diagram of a shift register circuit according to an embodiment of the present disclosure.

In an embodiment, as shown in FIGS. 2a and 2b, the control circuit may comprise a first control sub-circuit 31 and a second control sub-circuit 32.

The first control sub-circuit 31 is configured to receive the first reference signal Vref1, and output the first reference signal Vref1 to the first node A under the control of a signal at the second node B.

The second control sub-circuit 32 is configured to receive the first reference signal Vref1 and a second reference signal Vref2, output the second reference signal Vref2 to the second node B under the control of only the second reference signal Vref2, and output the first reference signal Vref1 to the second node B under the control of a signal at the first node A. In this way, the potentials at the first node A and the second node B are controlled to be inverted, which prevents the potentials at the first node A and the second node B from interfering with an output driving signal.

The multi-output circuit 4 is configured to receive the first reference signal Vref1 and M clock signals CK_m (where m is an integer, and 1≤m≤M; and M=3 is taken as an example in FIG. 1), and M driving signals Output_m are output according to each clock signal CK_m and the first reference signal Vref1 under the control of the signals at the first node A and the second node B; where M is an integer greater than or equal to 2.

In an embodiment, as shown in FIGS. 2a and 2b (M=3 is taken as an example in both FIGS. 2a and 2b), the multi-output circuit may comprise M output sub-circuits 41_m each configured to receive the first reference signal Vref1 and a corresponding one of the M clock signals CK_m, and output a corresponding driving signal Output_m according to the received first reference signal Vref1 and corresponding one of the M clock signals CK_m under the control of the signals at the first node A and the second node B. Thus, each output sub-circuit outputs a driving signal.

In the embodiment of FIGS. 2a and 2b, each output sub-circuit is connected to a clock signal, and different output sub-circuits are connected to different clock signals. Therefore, the output sub-circuits are in one-to-one correspondence to the clock signals, and it may be considered that each output sub-circuit 41_m is connected to a "corresponding clock signal CK_m".

Figure 3:
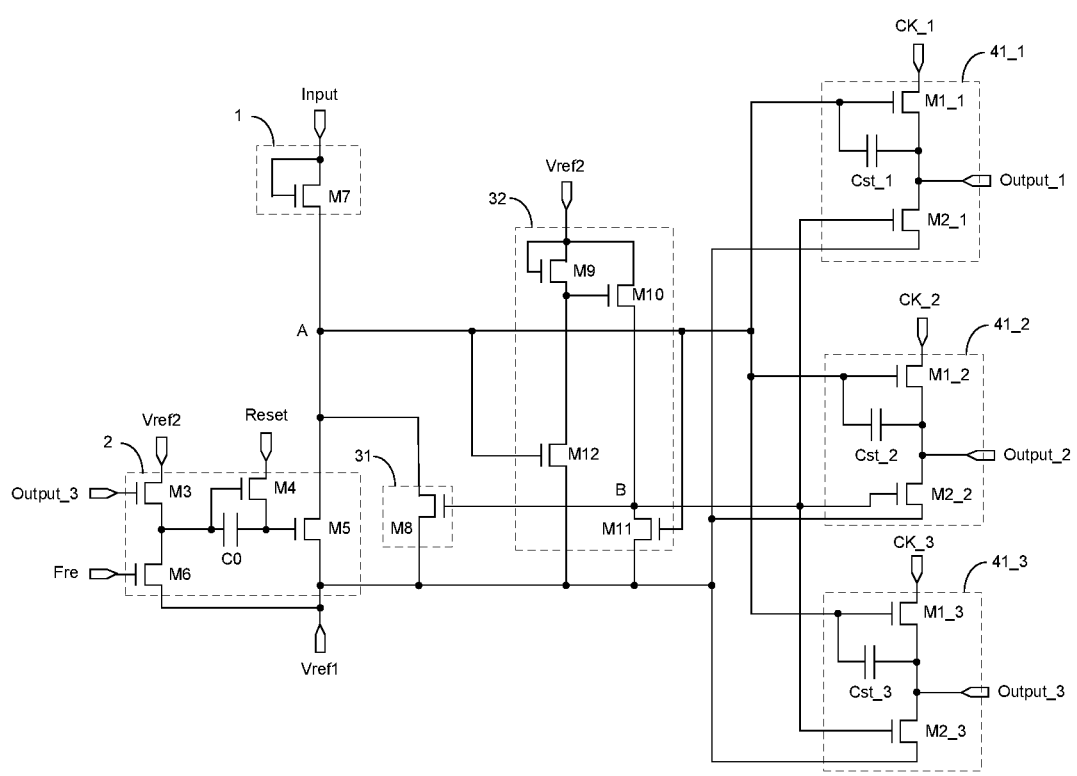
FIG. 3 is a specific structural diagram of a shift register circuit according to an embodiment of the present disclosure.
Figure 4:
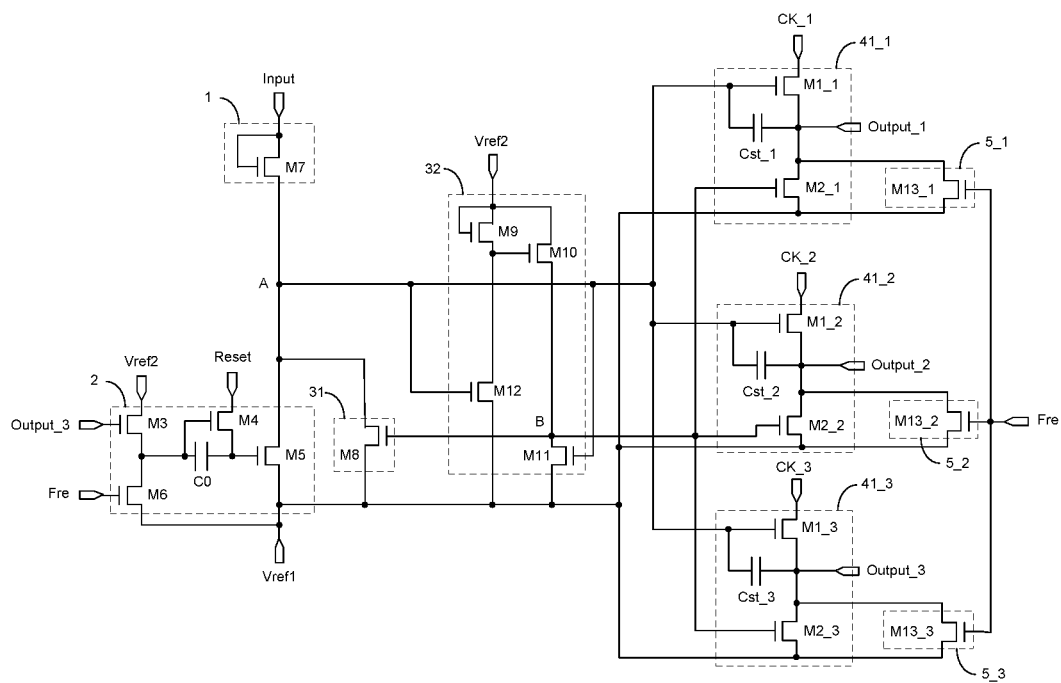
FIG. 4 is a specific structural diagram of a shift register circuit according to an embodiment of the present disclosure.

FIGS. 3 and 4 illustrate a more detailed exemplary structure of the shift register circuit of FIGS. 2a and 2b.

As shown in FIGS. 3 and 4, in an embodiment, the input circuit 1 may comprise a seventh switch transistor M7.

The seventh switch transistor M7 has a gate and a first electrode both configured to receive the input signal Input, and a second electrode connected to the first node A.

Specifically, when the seventh switch transistor is turned on under the control of the input signal, the input signal may be transmitted to the first node to control the potential at the first node.

In an embodiment, the reset circuit 2 may comprise a third switch transistor M3, a fourth switch transistor M4, a fifth switch transistor M5, a sixth switch transistor M6, and a stabilization capacitor C0.

The third switch transistor M3 has a gate configured to receive an $M^{th}$ driving signal Output_M, i.e., receiving a third driving signal Output_3, a first electrode configured to receive the second reference signal Vref2, and a second electrode connected to a gate of the fourth switch transistor M4.

The fourth switch transistor M4 has a first electrode configured to receive the reset signal Reset, and a second electrode connected to a gate of the fifth switch transistor M5.

The fifth switch transistor M5 has a first electrode configured to receive the first reference signal Vref1, and a second electrode connected to the first node A.

The sixth switch transistor M6 has a gate configured to receive a frame reset signal FRe, a first electrode configured to receive the first reference signal Vref1, and a second electrode connected to the gate of the fourth switch transistor M4.

The stabilization capacitor C0 is connected between the gate of the fourth switch transistor M4 and the gate of the fifth switch transistor M5.

In an embodiment, when the third switch transistor is turned on under the control of the $M^{th}$ driving signal, the second reference signal may be output to the gate of the fourth switch transistor. When the sixth switch transistor is turned on under the control of the frame reset signal, the first reference signal may be output to the gate of the fourth switch transistor. When the fourth switch transistor is turned on under the control of the signal input to the gate thereof, the reset signal may be output to the gate of the fifth switch transistor. When the fifth switch transistor is turned on under the control of the signal input to the gate thereof, the first reference signal may be output to the first node to perform reset control on the potential at the first node.

In an embodiment, the first control sub-circuit 31 may comprise an eighth switch transistor M8.

The eighth switch transistor M8 has a gate connected to the second node B, a first electrode configured to receive the first reference signal Vref1, and a second electrode connected to the first node A.

Specifically, when the eighth switch transistor is turned on under the control of the signal at the second node, the first reference signal may be output to the first node to control the potential at the first node.

In an embodiment, the second control sub-circuit 32 may comprise a ninth switch transistor M9, a tenth switch transistor M10, an eleventh switch transistor M11, and a twelfth switch transistor M12.

The ninth switch transistor M9 has a gate and a first electrode both configured to receive the second reference signal Vref2, and a second electrode connected to a gate of the tenth switch transistor M10.

The tenth switch transistor M10 has a first electrode configured to receive the second reference signal Vref2, and a second electrode connected to the second node B.

The eleventh switch transistor M11 has a gate connected to the first node A, a first electrode configured to receive the first reference signal Vref1, and a second electrode connected to the second node B.

The twelfth switch transistor M12 has a gate connected to the first node A, a first electrode configured to receive the first reference signal Vref1, and a second electrode connected to the gate of the tenth switch transistor M10.

Specifically, when the ninth switch transistor is turned on under the control of the second reference signal, the second reference signal may be output to the gate of the tenth switch transistor to control the tenth switch transistor to be turned on. When the twelfth switch transistor is turned on under the control of the first node, the first reference signal may be output to the gate of the tenth switch transistor to control the tenth switch transistor to be turned off. When the tenth switch transistor is turned on, the second reference signal may be output to the second node to control the potential at the second node. When the eleventh switch transistor is turned on under the control of the first node, the first reference signal may be output to the second node to control the potential at the second node.

In a specific implementation, width to length ratios of channels of the twelfth switch transistor and the ninth switch transistor are set, so that when the potential at the first node is a high potential, a rate at which the twelfth switch transistor outputs the first reference signal to the gate of the tenth switch transistor under the control of the signal at the first node is greater than a rate at which the ninth switch transistor outputs the second reference signal to the gate of the tenth switch transistor, and thereby the tenth switch transistor is turned on. Similarly, width to length ratios of the eleventh switch transistor and the tenth switch transistor are set, so that when a rate at which the eleventh switch transistor outputs the first reference signal to the second node is greater than a rate at which the tenth switch transistor outputs the second reference signal to the second node, it is ensured that the potential at the second node is a low potential, thereby avoiding abnormality of the output driving signal.

In an embodiment, the exemplary output sub-circuit 41_$m$ may comprise a first switch transistor M1_$m$, a second switch transistor M2_$m$, and a storage capacitor Cst_m.

The first switch transistor M1_$m$ has a gate connected to the first node A, a first electrode configured to receive a corresponding clock signal CK_m, and a second electrode configured to output a corresponding driving signal Output_m.

The second switch transistor M2_$m$ has a gate connected to the second node B, a first electrode configured to receive the first reference signal Vref1, and a second electrode configured to output the corresponding driving signal Output_m.

The storage capacitor Cst_m is connected between the first node A and the second electrode of the first switch transistor M1_$m$.

Specifically, when the first switch transistor is turned on under the control of the signal at the first node, the connected clock signal may be output as a corresponding driving signal, so that a potential of the driving signal is controlled through the connected clock signal. When the second switch transistor is turned on under the control of the signal at the second node, the connected first reference signal may be output as a corresponding driving signal so that the potential of the driving signal is controlled through the first reference signal. Charging and discharging are performed under the control of the signals at the first node and the second electrode of the first switch transistor, and when the first node is in a floating state, a voltage difference between the first node and the second electrode of the first switch transistor can be maintained to be stable due to the bootstrap action of the capacitor.

The shift register circuit according to the embodiments of the present disclosure comprises an input circuit, a reset circuit, a control circuit, and a multi-output circuit, wherein the multi-output circuit may be configured to output M driving signals. Therefore, each stage of shift register circuit may be connected to a plurality of gate lines. When the shift register circuit is applied to a display apparatus, a number of shift register circuits may be reduced, which is advantageous for a narrow bezel design.

In a specific implementation, when the shift register circuit according to the embodiments of the present disclosure is applied to the display apparatus, a first stage of shift register circuit corresponds to N gate lines in a display panel of the display apparatus, and therefore, the more the number of driving signals which can be output in the shift register circuit according to the embodiments of the present disclosure, the smaller the number of shift register circuits required when the shift register circuits are applied to the display apparatus. However, as the multi-output circuit in the shift register circuit is controlled by the first node and the second node, the more the number of driving signals in the shift register circuit, the longer the period of time in which the potential at the first node needs to be maintained, but in normal conditions, the potential at the first node may be attenuated after being maintained for a period of time, which influences the stability of the driving signal once the potential at the first node is attenuated. Therefore, in a specific implementation, in the shift register circuit according to the embodiments of the present disclosure, the multi-output circuit may output two driving signals, that is, M=2. Alternatively, the multi-output circuit may also output three driving signals, that is, M=3. Alternatively, the multi-output circuit may also output four driving signals, that is, M=4. Of course, the multi-output circuit may also output more driving signals, which is not limited here.

Further, in order to prevent an interference of a driving signal in a previous frame to a driving signal in a next period, in a specific implementation, in the shift register circuit according to the embodiments of the present disclosure, as shown in FIG. 2b, the shift register circuit may further comprise M frame reset circuits 5_m which are in one-to-one correspondence to the M output sub-circuits in the shift register circuit, and each of the M frame reset circuits 5 is configured to receive the frame reset signal FRe and the first reference signal Vref1, and reset a driving signal output by a corresponding output sub-circuit according to the first reference signal Vref1 under the control of the frame reset signal FRe. In this way, each driving signal is reset after a scanning process in one frame is performed, which can avoid the interference of the driving signal in the previous frame to the driving signal in the next frame.

In an embodiment, as shown in FIG. 4, the frame reset circuit 5_m may comprise a thirteenth switch transistor M13_m.

The thirteenth switch transistor M13_m has a gate configured to receive the frame reset signal FRe, a first electrode configured to receive the first reference signal Vref1, and a second electrode configured to output the reference signal Vref1 to reset the corresponding driving signal Output_m.

Specifically, when the thirteenth switch transistor is turned on under the control of the frame reset signal, the first reference signal may be output to reset the driving signal.

An operation process of the shift register circuit according to the embodiments of the present disclosure will be described below in conjunction with a circuit timing diagram. Here, M=3 is taken as an example for illustration. In the following description, 1 represents a high potential signal, and 0 represents a low potential signal, wherein 1 and 0 represent logic potentials thereof, which are only for better explanation of the operation process of the shift register circuit according to the embodiments of the present disclosure, instead of potentials applied to gates of various switch transistors in a specific implementation.

Figure 5:
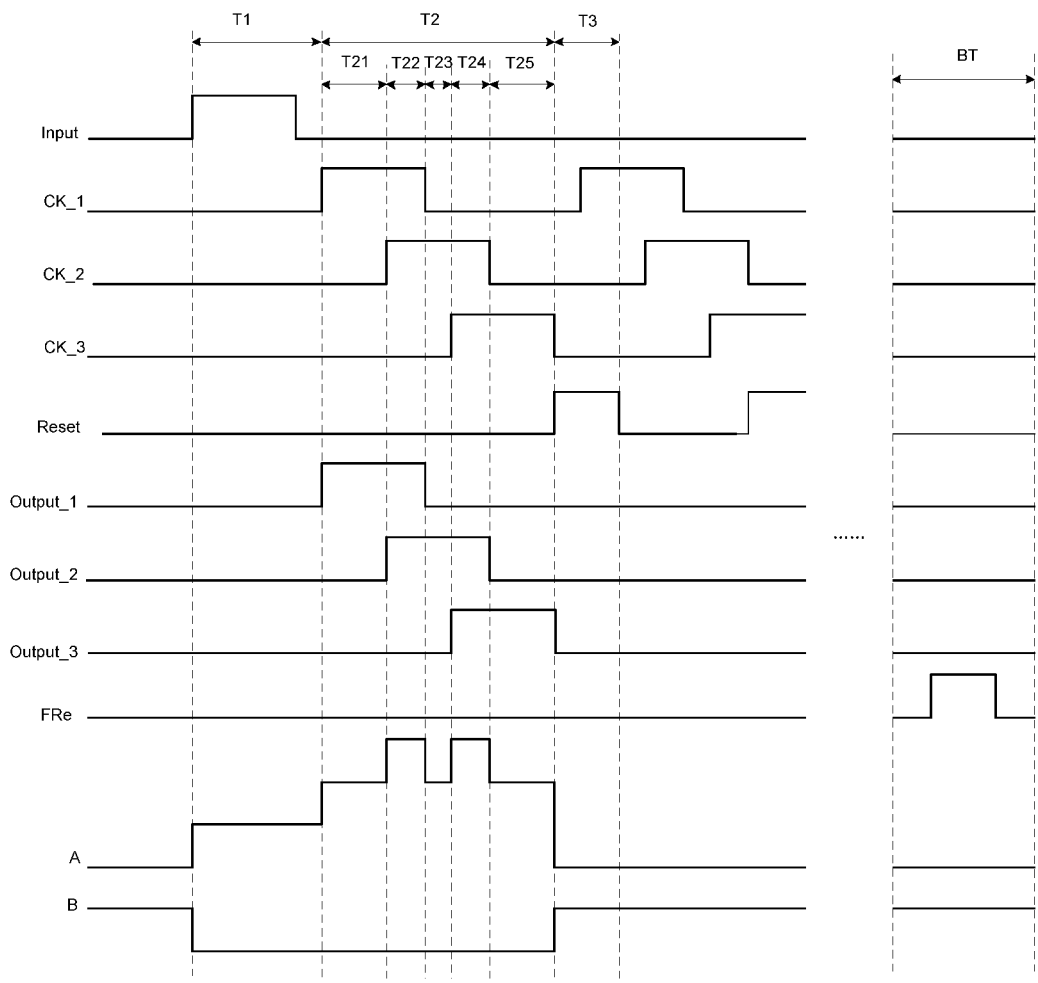
FIG. 5 is a circuit timing diagram according to an embodiment of the present disclosure.

An operation process of the shift register circuit shown in FIG. 3 will be described below by taking a structure of the shift register circuit shown in FIG. 3 as an example, and a corresponding circuit timing diagram is shown in FIG. 5. Specifically, an input phase T1, an output phase T2, and a reset phase T3 in the circuit timing diagram shown in FIG. 5 are selected. Here, the output phase T2 may be further divided into a first output sub-phase T21, a second output sub-phase T22, a third output sub-phase T23, a fourth output sub-phase T24, and a fifth output sub-phase T25. Here, the first reference signal Vref1 is a low potential signal, and the second reference signal Vref2 is a high potential signal.

As shown in FIG. 5, a Blanking Time (abbreviated as BT) is generally provided between two adjacent display frames. In a specific implementation, in the blanking time phase BT, the input signal Input, each clock signal CK_m, and the reset signal Reset are all low potential signals. Further, in a specific implementation, the frame reset signal FRe is a high potential signal in the blanking time phase BT, and is a low potential signal in other phases. Due to the action of the frame reset signal FRe in the blanking time phase BT, the sixth switch transistor M6 may be controlled to be turned on to output the first reference signal Vref1 at a low potential to the stabilization capacitor C0 and the gate of the fourth switch transistor M4, and the four switch transistor M4 may be controlled to be turned off to prevent the influence of the turn-on of the fourth switch transistor M4 on the potential at the first node A in an input phase T1 of a next display frame.

The operation process of the shift register circuit shown in FIG. 3 using the circuit timing diagram shown in FIG. 5 is as follows.

In the input phase T1, as Input=1, the seventh switch transistor M7 is turned on to output the input signal Input at a high potential to the first node A, so that the signal at the first node A is a high potential signal to control the eleventh switch transistor M11, the twelfth switch transistor M12, and the first switch transistors M1_1-M1_3 to be all turned on. As the twelfth switch transistor M12 is turned on to output the first reference signal Vref1 at a low potential to the gate of the tenth switch transistor M10, and as the eleventh switch transistor M11 is turned on to output the first reference signal Vref1 at a low potential to the second node B, the signal at the second node B is a low potential signal to control the second switch transistors M2_1~M2_3 to be all turned off. As the first switch transistor M1_1 is turned on, a clock signal CK_1 is output as a driving signal Output_1. As the first switch transistor M1_2 is turned on, a clock signal CK_2 is output as a driving signal Output_2. As the first switch transistor M1_3 is turned on, a clock signal CK_3 is output as a driving signal Output_3. Therefore, the shift register circuit outputs the driving signals Output_1-Output_3 in the input phase T1 respectively.

Then, the input signal Input is pulled down, that is, Input=0, and therefore, the seventh switch transistor M7 is turned off, so that the first node A is in a floating state. Due to the action of a storage capacitor Cst_1, the signal at the first node A may be maintained to be a high potential signal, to control the first switch transistors M1_1-M1_3 to be all turned on, so that the driving signals Output_1-Output_3 are all low potential signals.

In the output phase T2, in the first output sub-phase T21, Input=0, CK_1=1, CK_2=0, CK_3=0, and Output_3=0. As Input=0, the seventh switch transistor M7 is turned off, so that the first node A is in a floating state. Due to the action of the storage capacitor Cst_1, the signal at the first node A may be maintained to be a high potential signal, and the first switch transistors M1_1~M1_3 are all turned on. As the first switch transistor M1_1 is turned on and outputs the clock signal CK_1 as the driving signal Output_1, the driving signal Output_1 is a high potential signal. Due to the bootstrap action of the storage capacitor Cst_1, the potential of the signal at the first node A may be further pulled up to output the clock signal CK_1 as the driving signal Output_1, wherein the driving signal Output_1 is a high potential signal. As the first switch transistor M1_2 is turned on and outputs the clock signal CK_2 as the driving signal Output_2, the driving signal Output_2 is a low potential signal. As the first switch transistor M1_3 is turned on and outputs the clock signal CK_3 as the driving signal Output_3, the driving signal Output_3 is a low potential signal. As Output_3=0, the third switch transistor M3 is turned off. Further, as the signal at the first node A is a high potential signal, the eleventh switch transistor M11 and the twelfth switch transistor M12 are both turned on, and the signal at the second node B is a low potential signal, to control the second switch transistors M2_1-M2_3 to be all turned off.

In the second output sub-phase T22, Input=0, CK_1=1, CK_2=1, CK_3=0, and Output_3=0. As Input=0, the seventh switch transistor M7 is turned off, so that the first node A is in a floating state. As the potential of the signal at the first node A is pulled up under the bootstrap action of the high potential signals of the storage capacitor Cst_1 and CK_1, the first switch transistors M1_1~M1_3 are all turned on. As the first switch transistor M1_1 is turned on and outputs the clock signal CK_1 as the driving signal Output_1, the driving signal Output_1 is maintained to be a high potential signal. As the first switch transistor M1_2 is turned on and outputs the clock signal CK_2 as the driving signal Output_2, the driving signal Output_2 is maintained to be a high potential signal, and the potential of the signal at the first node A is further pulled up due to the bootstrap action of a storage capacitor Cst_2. As the first switch transistor M1_3 is turned on and outputs the clock signal CK_3 as the driving signal Output_3, the driving signal Output_3 is a low potential signal. As Output_3=0, the third switch transistor M3 is turned off. Further, as the signal at the first node A is a high potential signal, the eleventh switch transistor M11 and the twelfth switch transistor M12 are both turned on, so that the signal at the second node B is a low potential signal, to control the second switch transistors M2_1-M2_3 to be all turned off.

In the third output sub-phase T23, Input=0, CK_1=0, CK_2=1, CK_3=0, and Output_3=0. As Input=0, the seventh switch transistor M7 is turned off, so that the first node A is in a floating state. As the potential of the signal at the first node A is pulled up under the bootstrap action of the high potential signals of the storage capacitor Cst_2 and CK_2, the first switch transistors M1_1-M1_3 are all turned on. As the first switch transistor M1_1 is turned on, and the clock signal CK_1 at a low potential is output as the driving signal Output_1, the driving signal Output_1 is a low potential signal. As the first switch transistor M1_3 is turned on, and the clock signal CK_3 at a low potential is output as the driving signal Output_3, the driving signal Output_3 is a low potential signal. As the first switch transistor M1_2 is turned on, and the clock signal CK_2 at a high potential is output as the driving signal Output_2, the driving signal Output_2 is a high potential signal. Therefore, the potential of the signal at the first node A is pulled up only under the bootstrap action of the high potential signals of the storage capacitor Cst_2 and CK_2 in the T23 phase, so that the potential of the signal at the first node A in this phase is the same as the potential of the signal at the first node A in the T21 phase. Further, as the signal at the first node A is a high potential signal, the eleventh switch transistor M11 and the twelfth switch transistor M12 are both turned on, so that the signal at the second node B is a low potential signal, to control the second switch transistors M21-M23 to be all turned off.

In the T24 phase, Input=0, CK_1=0, CK_2=1, CK_3=1, and Output_3=1. As Input=0, the seventh switch transistor M7 is turned off, and the first node A is in a floating state. As the potential of the signal at the first node A is pulled up under the bootstrap action of the high potential signals of the storage capacitor Cst_2 and CK_2, the first switch transistors M1_1~M1_3 are all turned on. As the first switch transistor M1_1 is turned on and outputs the clock signal CK_1 at a low potential as the driving signal Output_1, the driving signal Output_1 is maintained to be a low potential signal. As the first switch transistor M1_2 is turned on and outputs the clock signal CK_2 at a high potential as the driving signal Output_2, the driving signal Output_2 is a high potential signal. As the first switch transistor M1_3 is turned on and outputs the clock signal CK_3 at a high potential as the driving signal Output_3, the driving signal Output_3 is a high potential signal, and the potential of the signal at the first node A may be further pulled up under the bootstrap action of a storage capacitor Cst_3. Therefore, on the basis that the potential of the signal at first node A is pulled up under the bootstrap action of the high potential signals of the storage capacitor Cst_2 and CK_2 in the T24 phase, the potential of the signal at first node A is further pulled up under the bootstrap action of the high potential signals of the storage capacitor Cst_3 and CK_3 in the T24 phase, so that the potential of the signal at the first node A in this phase is the same as the potential of the signal at the first node A in the T22 stage. As Output_3=1, the third switch transistor M3 is turned on and outputs the second reference signal Vref2 at a high potential to the gate of the fourth switch transistor M4 and the stabilization capacitor C0 to control the fourth switch transistor M4 to be turned on. The turned-on fourth switch transistor M4 outputs the reset signal Reset at a low potential to the gate of the fifth switch transistor M5, so that the fifth switch transistor M5 is turned off, so as not to influence the potential at the first node A. Further, as the signal at the first node A is a high potential signal, the eleventh switch transistor M11 and the twelfth switch transistor M12 are both turned on, so that the signal at the second node B is a low potential signal to control the second switch transistors M2_1-M2_3 to be all turned off.

In the T25 phase, Input=0, CK_1=0, CK_2=0, CK_3=1, and Output_3=1. As Input=0, the seventh switch transistor M7 is turned off, so that the first node A is in a floating state. As the potential of the signal at the first node A is pulled up under the bootstrap action of the high potential signals of the storage capacitor Cst3 and CK_3, the first switch transistors M1_1-M1_3 are all turned on. As the first switch transistor M1_1 is turned on and outputs the clock signal CK_1 at a low potential as the driving signal Output_1, the driving signal Output_1 is a low potential signal. As the first switch transistor M1_2 is turned on and outputs the clock signal CK_2 at a low potential as the driving signal Output_2, the driving signal Output_2 is a low potential signal. As the first switch transistor M1_3 is turned on and outputs the clock signal CK_3 at a high potential as the driving signal Output_3, the driving signal Output_3 is a high potential signal. Therefore, the potential of the signal at the first node A is pulled up only under the bootstrap action of the high potential signals of the storage capacitor Cst_3 and CK_3 in the T25 phase, so that the potential of the signal at the first node A in this phase is the same as the potential of the signal at the first node A in the T21 phase. As Output_3=1, the third switch transistor M3 is turned on and outputs the second reference signal Vref2 at a high potential to the gate of the fourth switch transistor M4 and the stabilization capacitor C0 to control the fourth switch transistor M4 to be turned on. The turned-on fourth switch transistor M4 outputs the reset signal Reset at a low potential to the gate of the fifth switch transistor M5, so that the fifth switch transistor M5 is turned off, so as not to influence the potential at the first node A. Further, as the signal at the first node A is a high potential signal, the eleventh switch transistor M11 and the twelfth switch transistor M12 are both turned on, so that the signal at the second node B is a low potential signal, to control the second switch transistors M2_1-M2_3 to be all turned off.

In the reset phase T3, Input=0, Output_3=0, and Reset=1. As Input=0, the seventh switch transistor M7 is turned off. As Output_3=0, the third switch transistor M3 is turned off, the gate of the fourth switch transistor M4 is in a floating state, and the signal at the gate of the fourth switch transistor M4 may be maintained to be a high potential signal due to the action of the stabilization capacitor C0, so that the fourth switch transistor M4 is turned on. The turned-on fourth switch transistor M4 outputs the reset signal Reset at a high potential to the gate of the fifth switch transistor M5 to control the fifth switch transistor M5 to be turned on, to output the first reference signal Vref1 at a low potential to the first node A, so that the signal at the first node A is a low potential signal, thereby controlling the eleventh switch transistor M11, the twelfth switch transistor M12, and the first switch transistors M1_1-M1_3 to be all turned off. As the ninth switch transistor M9 is turned on under the control of the second reference signal Vref2, the second reference signal Vref2 is provided to the gate of the tenth switch transistor M10, to control the tenth switch transistor M10 to be turned on. The turned-on tenth switch transistor M10 outputs the second reference signal Vref2 at a high potential to the second node B, so that the signal at the second node B is a high potential signal to control the eighth switch transistor M8 and the second switch transistors M2_1-M2_3 to be all turned on. The turned-on eighth switch transistor M8 provides the first reference signal Vref1 at a low potential to the first node A, which further causes the signal at the first node A to be a low potential signal. The turned-on second switch transistor M2_1 outputs the first reference signal Vref1 at a low potential as the driving signal Output_1, so that the driving signal Output_1 is a low potential signal. The turned-on second switch transistor M2_2 outputs the first reference signal Vref1 at a low potential as the driving signal Output_2, so that the driving signal Output_2 is a low potential signal. The turned-on second switch transistor M2_3 outputs the first reference signal Vref1 at a low potential as the driving signal Output_3, so that the driving signal Output_3 is a low potential signal.

Before the blanking time phase BT arrives after the reset phase T3, the fourth switch transistor M4 is always in a turn-on state due to the retention action of the stabilization capacitor C0, so that the signal at the first node A may be reset once each time the reset signal Reset is a high potential signal. Thereby, the signal at the first node A may be reset multiple times in one display frame to prevent instability of the signal at the first node A from interfering with the output.

After one frame, in the blanking time phase BT, the frame reset signal FRe is a high potential signal, and therefore the sixth switch transistor M6 is turned on to output the first reference signal Vref1 at a low potential to the gate of the fourth switch transistor M4 and the stabilization capacitor C0, to control the stabilization capacitor C0 to discharge, and control the fourth switch transistor M4 to be turned off to prevent the fourth switch transistor M4 from influencing the signal at the first node A when the input signal Input is at a high potential in a next display frame.

As shown in FIG. 5, the driving signal Output_1, the driving signal Output_2, and the driving signal Output_3 sequentially have the same phase difference, which is less than ⅓ clock cycle.

As shown in FIG. 5, the clock signal CK_1, the clock signal CK_2, and the clock signal CK_3 sequentially have the same phase difference, which is less than ⅓ clock cycle.

The shift register circuit according to the embodiments of the present disclosure may output three different driving signals only through the cooperation of sixteen switch transistors and four capacitors, so that one stage of shift register circuit can drive three gate lines. Compared with a solution in the related art that it is required to provide three stages of shift register circuits, a number of the shift register circuits according to the embodiments of the present disclosure may be reduced by 2, thereby facilitating a narrow bezel design when the shift register circuit is applied to the display apparatus.

An operation process of the shift register circuit shown in FIG. 4 will be described by taking a structure of the shift register circuit shown in FIG. 4 as an example, and a corresponding circuit timing diagram is shown in FIG. 5. Specifically, an input phase T1, an output phase T2, and a reset phase T3 in the circuit timing diagram shown in FIG. 5 are selected. Here, the output phase T2 may be further divided into a first output sub-phase T21, a second output sub-phase T22, a third output sub-phase T23, a fourth output sub-phase T24, and a fifth output sub-phase T25. Here, the first reference signal Vref1 is a low potential signal, and the second reference signal Vref2 is a high potential signal.

The structure of the shift register circuit shown in FIG. 4 differs from the structure of the embodiments shown in FIG. 3 in that frame reset circuits 5_m, that is, thirteenth switch transistors M13_1 to M13_3, are added in the structure of FIG. 4. Therefore, the operation process of the shift register circuit shown in FIG. 4 in the input phase T1, the output phase T2, and the reset phase T3 is substantially the same as that of the embodiment of FIG. 3, and details are not described here. The operation process of the shift register circuit in a blanking time phase BT will be exemplarily described in detail in the present embodiment.

In the blanking time phase BT, as the frame reset signal FRe is a high potential signal, the sixth switch transistor M6 and the thirteenth switch transistors M13_1 to M13_3 are all turned on. The turned-on sixth switch transistor M6 outputs the first reference signal Vref1 at a low potential to the gate of the fourth switch transistor M4 and the stabilization capacitor C0 to control the stabilization capacitor C0 to discharge and control the fourth switch transistor M4 to be turned off to prevent the fourth switch transistor M4 from influencing the signal at the first node A when the input signal Input is at a high potential in a next display frame. The turned-on thirteenth switch transistor M13_1 outputs the first reference signal Vref1 at a low potential as the driving signal Output_1 to perform frame reset on the driving signal Output_1. The turned-on thirteenth switch transistor M13_2 outputs the first reference signal Vref1 at a low potential as the driving signal Output_2 to perform frame reset on the driving signal Output_2. The turned-on thirteenth switch transistor M13_3 outputs the first reference signal Vref1 at a low potential as the driving signal Output_3 to perform frame reset on the driving signal Output_3. Thereby, the problem that driving signals of two adjacent display frames interfere with each other can be avoided.

The above description is only made by taking switch transistors in the shift register circuit being N-type transistors as an example. When the switch transistors included in the shift register circuit are P-type transistors, a stable output operation of the corresponding shift register circuit can be realized only by inverting potentials of the above signals, and a specific process will not be described here.

It should be illustrated that in the input phase, the clock signal CK_2 and the clock signal CK_3 each have a phase in which it is a high potential signal, and therefore the corresponding gate line may further be pre-charged to improve the driving capability.

Figure 6:
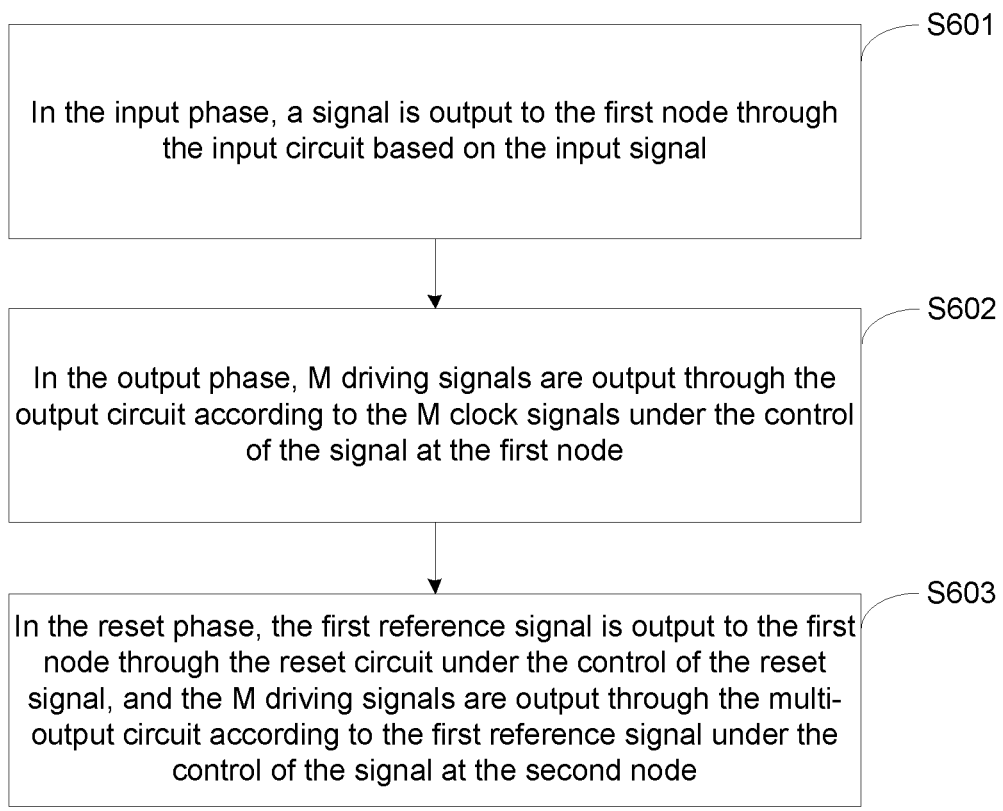
FIG. 6 is a flowchart of a method for driving a shift register circuit according to an embodiment of the present disclosure.

The embodiments of the present disclosure further provide a method for driving any of the above shift register circuits according to the embodiments of the present disclosure. As shown in FIG. 6, the method may comprise: an input phase, an output phase, and a reset phase.

In S601, in the input phase, a signal is output to the first node through the input circuit based on the input signal.

In S602, in the output phase, M driving signals are output through the output circuit according to the M clock signals under the control of the signal at the first node.

In S603, in the reset phase, the first reference signal is output to the first node through the reset circuit under the control of the reset signal, and the M driving signals are output through the multi-output circuit according to the first reference signal under the control of the signal at the second node.

The method according to the embodiments of the present disclosure can output M driving signals, and when the shift register circuit is applied to a display apparatus, a number of shift register circuits can be reduced, which is advantageous for a narrow bezel design.

In a specific implementation, various clock signals have the same cycle, and various driving signals are in one-to-one correspondence to the clock signals. When the shift register circuit according to the embodiments of the present disclosure is connected to three clock signals, three driving signals are output, and the three different clock signals may be defined as a clock signal CK_1 to a third clock signal CK_3; wherein the first clock signal CK_1 to the third clock signal CK_3 sequentially have the same phase difference, which may be less than ⅓ clock cycle. When the shift register circuit according to the embodiments of the present disclosure is connected to four clock signals, four driving signals are output, and the four different clock signals may be defined as a first clock signal CK_1 to a fourth clock signal CK_4; wherein the first clock signal CK_1 to the fourth clock signal CK_4 sequentially have the same phase difference, which is less than ¼ clock cycle.

In a specific implementation, when the shift register circuit according to the embodiments of the present disclosure outputs three driving signals, with respect to an operation process of one stage of shift register circuit in each frame, as shown in FIG. 5, a rising edge of the reset signal Reset is aligned with a falling edge of the clock signal CK_3, and a falling edge of the reset signal Reset is ahead of a rising edge of the clock signal CK_2. The above description is made only by taking an effective pulse signal of the input signal Input being a high potential signal as an example. When the effective pulse signal of the input signal Input is a low potential signal, a stable operation of the corresponding shift register circuit can be realized only by inverting the potential of the Reset signal.

The embodiments of the present disclosure further provide a gate driving circuit, comprising: N cascaded shift register circuits according to any of the above embodiments of the present disclosure, wherein the M driving signals are sequentially defined as a first driving signal to an $M^{th}$ driving signal in a scanning order, where N is a positive integer greater than 1, wherein an input signal of a first stage of shift register circuit is a frame start signal; and an input signal of each of remaining stages of shift register circuits other than the first stage of shift register circuit is an $n^{th}$ driving signal of a previous stage of shift register circuit, where when M is an even, $$n = \frac{M}{2} + 1,$$

and when M is an odd, $$n = \frac{M+1}{2}.$$

Figure 7:
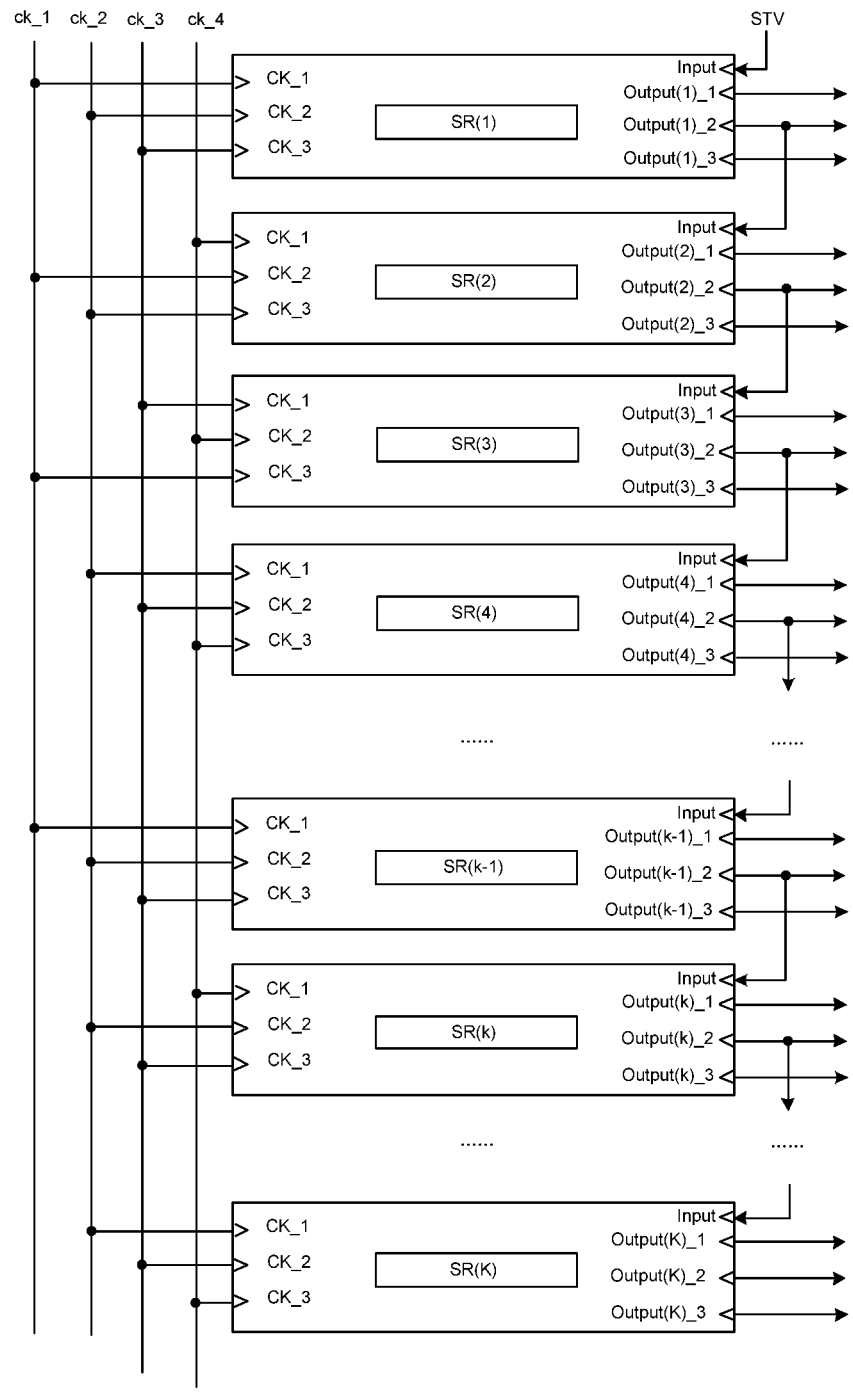
FIG. 7 is a structural diagram of a gate driving circuit according to an embodiment of the present disclosure.

In a specific implementation, by taking M=3 as an example, as shown in FIG. 7, the gate driving circuit comprises a plurality of cascaded shift register circuits: SR(1), SR(2), SR(3), SR(4) . . . SR(k−1), SR(k) . . . SR(K−1), SR(K) (with a total of K shift register circuits, where 1≤k≤K), wherein a frame start signal STV is input as an input signal Input of the first stage of shift register circuit SR(1);

except for the first stage of shift register circuit SR(1), an input signal Input of each of remaining stages of shift register circuits SR(k) is a third driving signal Output_3 of a previous stage of shift register circuit SR(k−1) which is adjacent to the current stage of shift register circuit SR(k).

Figure 8:
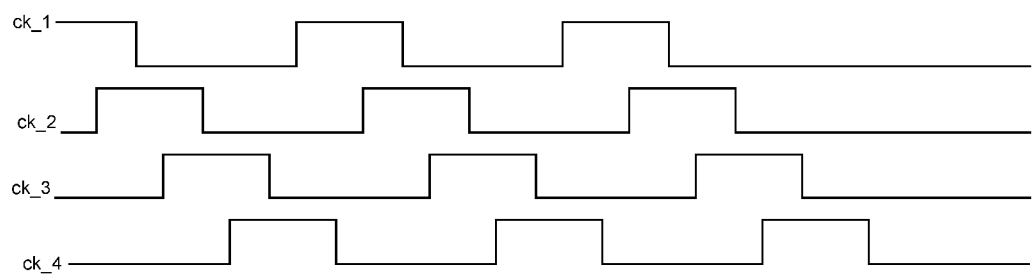
FIG. 8 is a diagram of a clock signal transmitted on a clock signal line connected to the gate driving circuit shown in FIG. 7.
Figure 9:
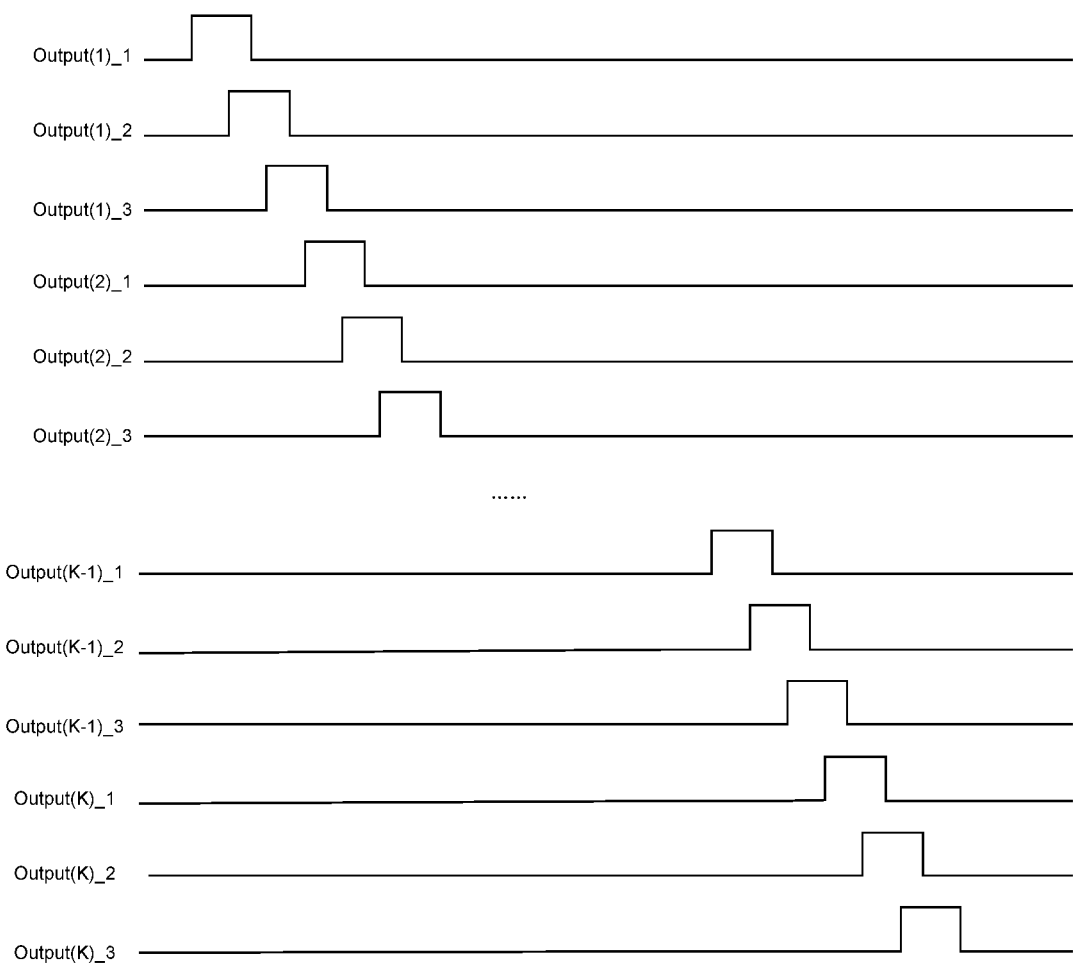
FIG. 9 is a timing diagram of a driving signal output by the gate driving circuit shown in FIG. 7.

In a specific implementation, by taking M=3 as an example, as shown in FIG. 7, a clock signal CK_1 of a $(4a-3)^{th}$ stage of shift register circuit, a clock signal CK_2 of a $(4a-2)^{th}$ stage of shift register circuit, and a clock signal CK_3 of a $(4a-1)^{th}$ stage of shift register circuit are connected to the same clock signal line ck_1. A clock signal CK_2 of the $(4a-3)^{th}$ stage of shift register circuit, a clock signal CK_3 of the $(4a-2)^{th}$ stage of shift register circuit, and a clock signal CK_1 of a $(4a)^{th}$ stage of shift register circuit are connected to the same clock signal line ck_2. A clock signal CK_3 of the $(4a-3)^{th}$ stage of shift register circuit, a clock signal CK_1 of the $(4a-1)^{th}$ stage of shift register circuit, and a clock signal CK_2 of the $(4a)^{th}$ stage of shift register circuit are connected to the same clock signal line ck_3. A clock signal CK_1 of the $(4a-2)^{th}$ stage of shift register circuit, a clock signal CK_2 of the $(4a-1)^{th}$ stage of shift register circuit, and a clock signal CK_3 of the $(4a)^{th}$ stage of shift register circuit are connected to the same clock signal line ck_4. Here, a is a positive integer. As shown in FIG. 8, clock signals output from the clock signal line ck_1 to the clock signal line ck_4 sequentially have the same phase difference, which is less than ⅓ clock cycle. A timing diagram of driving signals output by the entire gate driving circuit is as shown in FIG. 9.

The gate driving circuit comprises multiple stages of cascaded shift register circuits, so that driving signals are sequentially input to gate lines in a display panel of the display apparatus through the gate driving circuit. Here, a scanning order is generally from a first row of gate lines to a last row of gate lines of the display panel, which of course refers to a scanning order during forward scanning. In practical applications, there may also be reverse scanning for display panel, in which case the scanning order is from the last row of gate lines to the first row of gate lines of the display panel. Thereby, the M driving signals may be sequentially defined as a first driving signal to an $M^{th}$ driving signal in the scanning order to sequentially drive M (for example, adjacent) gate lines when being applied to the display panel.

In the gate driving circuit, for a certain stage of shift register circuit, a driving signal output by a next stage of shift register circuit is generally used as a reset signal of the current stage of shift register circuit to reset a signal at a first node in the shift register circuit, which causes the cascaded shift register circuits to influence each other. For example, in FIGS. 2a and 2b, the Reset signal received by the shift register circuit may be a driving signal output by a next stage of shift register circuit.

In another embodiment, various stages of shift register circuits may receive the same reset signal, wherein the reset signal is a periodic square wave signal, with each cycle comprising a turn-on period in which the reset circuit is turned on and a turn-off period in which the reset circuit is turned off, wherein each of the turn-on periods comprises a first edge and a second edge appearing successively in time. Here, a first edge of a turn-on period of an $i^{th}$ cycle of the reset signal is synchronized with or lags behind a second edge of a current period of an $M^{th}$ clock signal in an $i^{th}$ stage of shift register circuit, and is synchronized with or is ahead of a first edge of a next cycle of the $M^{th}$ clock signal, where $1 \leq i \leq N$. Therefore, the reset signal may be used to reset the first node in time in one display frame after a last gate driving signal is output in one shift register circuit and before a next cycle of a clock signal in the shift register circuit arrives, so as not to influence the driving signal output to each gate line, thereby not influencing the display content. In this embodiment, the influence due to cascaded reset among various stages of shift register circuits can be avoided.

In an embodiment, various stages of shift register circuits may receive the same frame reset signal, wherein a first edge of the frame reset signal lags behind or is synchronized with a second edge of a last clock signal in a last stage of shift register circuit in a current period, and a second edge of the frame reset signal is ahead of or synchronized with a first edge of a first clock signal in a first stage of shift register circuit in a next period.

Figure 11:
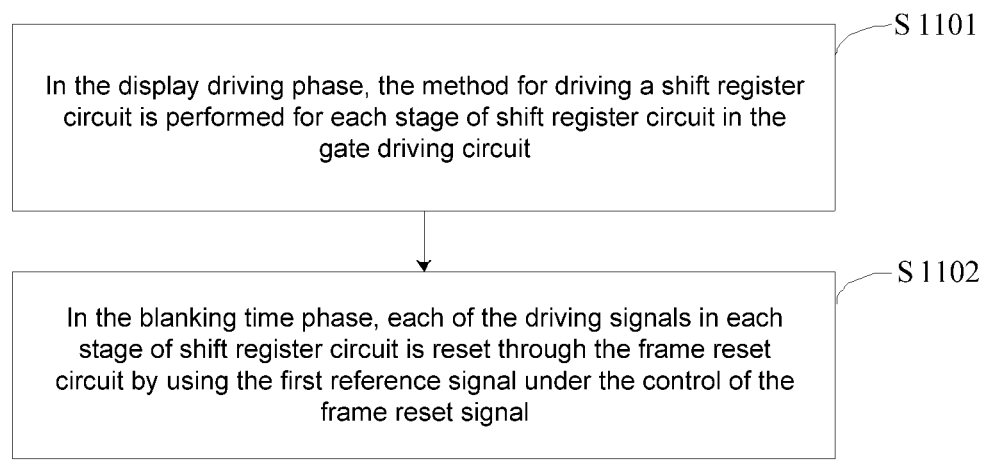
FIG. 11 is a flowchart of a method for driving a gate driving circuit according to an embodiment of the present disclosure.

The embodiments of the present disclosure further provide a method for driving a gate driving circuit according to any of the above embodiments of the present disclosure. As shown in FIG. 11, the method for driving the gate driving circuit comprises a display driving phase and a blanking time phase.

In S1101, in the display driving phase, the method for driving a shift register circuit in FIG. 6 is performed for each stage of shift register circuit in the gate driving circuit.

In S1102, in the blanking time phase, each of the driving signals in each stage of shift register circuit is reset through the frame reset circuit by using the first reference signal under the control of the frame reset signal.

Figure 10:
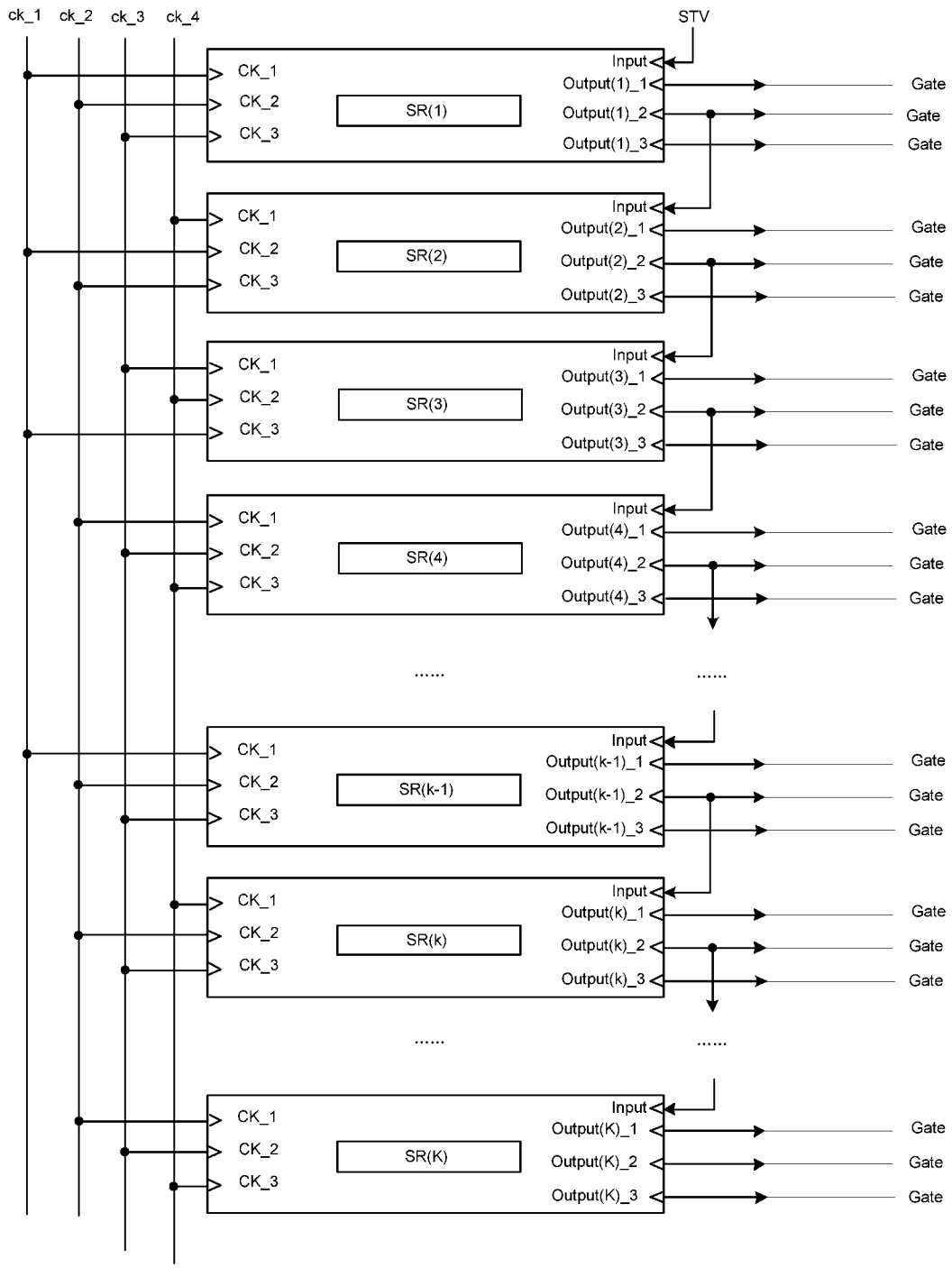
FIG. 10 is a structural diagram of a display apparatus according to an embodiment of the present disclosure.

The embodiments of the present disclosure further provide a display apparatus, as shown in FIG. 10 (by taking M=3 as an example), comprising a plurality of gate lines and the gate driving circuit according to any of the embodiments of the present disclosure. Here, each stage of shift register circuit SR(k) drives M gate lines Gate of the plurality of gate lines respectively. For an implementation of the display apparatus, reference can be made to the embodiments of the shift register circuit described above, and the repeated parts will not be described.

In a specific implementation, the display apparatus according to the embodiments of the present disclosure may be any product or component having a display function, such as a mobile phone, a tablet computer, a television, a display, a notebook computer, a digital photo frame, a navigator, etc. It can be understood by those of ordinary skill in the art that there are other indispensable components of the display apparatus, which will not be described here, and should not be construed as limiting the present disclosure.

It will be apparent to those skilled in the art that various modifications and changes can be made in the present disclosure without departing from the spirit and scope of the present disclosure. Thus, if these modifications and changes fall within the scope of the claims of the present disclosure and equivalent technologies thereof, these amendments and changes are also intended to be included within the present disclosure.

We claim:

1. A shift register circuit, comprising an input circuit, a reset circuit, a control circuit and a multi-output circuit, wherein:
   the input circuit is configured to receive an input signal and output a signal to a first node based on the input signal;
   the reset circuit is configured to receive a reset signal and a first reference signal, and output the first reference signal to the first node under control of the reset signal;
   the control circuit is configured to control a potential at the first node to be an inverted potential of a potential at a second node; and
   the multi-output circuit is configured to receive the first reference signal and M clock signals, and output M driving signals according to the corresponding M clock signals and the first reference signal under the control of signals at the first node and the second node, where M is an integer greater than or equal to 2,
   wherein the M driving signals are sequentially defined as a first driving signal to an $M^{th}$ driving signal in a scanning order; and
   the reset circuit is further configured to receive the $M^{th}$ driving signal, a second reference signal, and a frame reset signal, and output the first reference signal to the first node under the control of all the $M^{th}$ driving signal, the frame reset signal, and the reset signal.

2. The shift register circuit according to claim 1, wherein the multi-output circuit comprises M output sub-circuits each configured to receive the first reference signal and a corresponding one of the M clock signals, and output a corresponding driving signal according to the received first reference signal and corresponding clock signal under the control of the signals at the first node and the second node.

3. The shift register circuit according to claim 2, wherein the output sub-circuit comprises a first switch transistor, a second switch transistor, and a storage capacitor, wherein:
   the first switch transistor has a gate connected to the first node, a first electrode configured to receive a corresponding clock signal, and a second electrode configured to output a corresponding driving signal;
   the second switch transistor has a gate connected to the second node, a first electrode configured to receive the first reference signal, and a second electrode configured to output the corresponding driving signal; and
   the storage capacitor is connected between the first node and the second electrode of the first switch transistor.

4. The shift register circuit according to claim 1, wherein the reset circuit comprises a third switch transistor, a fourth switch transistor, a fifth switch transistor, a sixth switch transistor, and a stabilization capacitor, wherein:
   the third switch transistor has a gate configured to receive the $M^{th}$ driving signal, a first electrode configured to receive the second reference signal, and a second electrode connected to a gate of the fourth switch transistor;
   the fourth switch transistor has a first electrode configured to receive the reset signal, and a second electrode connected to a gate of the fifth switch transistor;

the fifth switch transistor has a first electrode configured to receive the first reference signal, and a second electrode connected to the first node;

the sixth switch transistor has a gate configured to receive the frame reset signal, a first electrode configured to receive the first reference signal, and a second electrode connected to the gate of the fourth switch transistor; and the stabilization capacitor is connected between the gate of the fourth switch transistor and the gate of the fifth switch transistor.

5. The shift register circuit according to claim 1, wherein the input circuit comprises a seventh switch transistor, wherein:

the seventh switch transistor has a gate and a first electrode both configured to receive the input signal, and a second electrode connected to the first node.

6. The shift register circuit according to claim 1, wherein the control circuit comprises a first control sub-circuit and a second control sub-circuit, wherein:

the first control sub-circuit is configured to receive the first reference signal, and output the first reference signal to the first node under control of a signal at the second node; and the second control sub-circuit is configured to receive the first reference signal and the second reference signal, output the second reference signal to the second node under control of only the second reference signal, and output the first reference signal to the second node under control of the signal at the first node.

7. The shift register circuit according to claim 6, wherein the first control sub-circuit comprises an eighth switch transistor, wherein:

the eighth switch transistor has a gate connected to the second node, a first electrode configured to receive the first reference signal, and a second electrode connected to the first node.

8. The shift register circuit according to claim 6, wherein the second control sub-circuit comprises a ninth switch transistor, a tenth switch transistor, an eleventh switch transistor, and a twelfth switch transistor, wherein:

the ninth switch transistor has a gate and a first electrode both configured to receive the second reference signal, and a second electrode connected to a gate of the tenth switch transistor;

the tenth switch transistor has a first electrode configured to receive the second reference signal, and a second electrode connected to the second node;

the eleventh switch transistor has a gate connected to the first node, a first electrode configured to receive the first reference signal, and a second electrode connected to the second node; and the twelfth switch transistor has a gate connected to the first node, a first electrode configured to receive the first reference signal, and a second electrode connected to the gate of the tenth switch transistor.

9. The shift register circuit according to claim 2, further comprising M frame reset circuits in one-to-one correspondence to the M output sub-circuits, and each configured to receive the frame reset signal and the first reference signal, and reset a driving signal output by a corresponding output sub-circuit according to the first reference signal under control of the frame reset signal.

10. The shift register circuit according to claim 9, wherein the frame reset circuit comprises a thirteenth switch transistor, wherein:

the thirteenth switch transistor has a gate configured to receive the frame reset signal, a first electrode configured to receive the first reference signal, and a second electrode configured to output the first reference signal to reset the driving signal.

11. A gate driving circuit, comprising N cascaded shift register circuits according to claim 1, wherein the M driving signals are sequentially defined as a first driving signal to an $M^{th}$ driving signal in a scanning order, where N is a positive integer greater than 1, wherein:

an input signal of a first stage of shift register circuit is a frame start signal; and an input signal of each remaining stage of shift register circuits other than the first stage of shift register circuit is an $n^{th}$ driving signal of a previous stage of shift register circuit, wherein when M is an even number, $$n = \frac{M}{2} + 1,$$

and when M is an odd number, $$n = \frac{M+1}{2}.$$

12. A display apparatus, comprising a plurality of gate lines and the gate driving circuit according to claim 11, wherein each stage of shift register circuit drives M gate lines of the plurality of gate lines, respectively.

13. A method for driving the shift register circuit according to claim 1, comprising an input phase, an output phase, and a reset phase, comprising:

in the input phase, outputting a signal to the first node through the input circuit based on the input signal;

in the output phase, outputting the M driving signals according to the M clock signals through the output circuit under the control of the signal at the first node; and in the reset phase, outputting the first reference signal to the first node through the reset circuit under the control of the reset signal, and outputting the M driving signals through the multi-output circuit according to the first reference signal under the control of the signal at the second node.

14. A method for driving shift register circuits with the gate driving circuit according to claim 11, comprising:

in a display driving phase, performing a sub-method for each stage of shift register circuit in the gate driving circuit, the sub-method comprising an input phase, an output phase, and a reset phase, and comprising:

in the input phase, outputting a signal to the first node through the input circuit based on the input signal;

in the output phase, outputting the M driving signals according to the M clock signals through the output circuit under the control of the signal at the first node; and in the reset phase, outputting the first reference signal to the first node through the reset circuit under the control of the reset signal, and outputting the M driving signals through the multi-output circuit according to the first reference signal under the control of the signal at the second node; and in a blanking time phase, resetting each of the driving signals in each stage of shift register circuit through a frame reset circuit by using the first reference signal under the control of the frame reset signal.

15. A gate driving circuit, comprising N cascaded shift register circuits according to claim 2, wherein the M driving signals are sequentially defined as a first driving signal to an $M^{th}$ driving signal in a scanning order, where N is a positive integer greater than 1, wherein
an input signal of a first stage of shift register circuit is a frame start signal; and
an input signal of each of remaining stages of shift register circuits other than the first stage of shift register circuit is an $n^{th}$ driving signal of a previous stage of shift register circuit,
wherein when M is an even number, $$n = \frac{M}{2} + 1,$$

and when M is an odd number, $$n = \frac{M+1}{2}.$$

16. A method for driving the shift register circuit according to claim 2, comprising an input phase, an output phase, and a reset phase, comprising:
in the input phase, outputting a signal to the first node through the input circuit based on the input signal,
in the output phase, outputting M driving signals according to the M clock signals through the output circuit under the control of the signal at the first node, and
in the reset phase, outputting the first reference signal to the first node through the reset circuit under the control of the reset signal, and outputting the M driving signals through the multi-output circuit according to the first reference signal under the control of the signal at the second node.

17. A method for driving shift register circuits with the gate driving circuit according to claim 15, comprising:
in a display driving phase, performing a sub-method for each stage of shift register circuit in the gate driving circuit, the sub-method comprising an input phase, an output phase, and a reset phase, and comprising:
in the input phase, outputting a signal to the first node through the input circuit based on the input signal;
in the output phase, outputting the M driving signals according to the M clock signals through the output circuit under the control of the signal at the first node; and
in the reset phase, outputting the first reference signal to the first node through the reset circuit under the control of the reset signal, and outputting the M driving signals through the multi-output circuit according to the first reference signal under the control of the signal at the second node; and
in a blanking time phase, resetting each of the driving signals in each stage of shift register circuit through a frame reset circuit by using the first reference signal under the control of the frame reset signal.

* * * * *